United States Patent [19]

Kato

[11] Patent Number: 5,535,161
[45] Date of Patent: Jul. 9, 1996

[54] SEMICONDUCTOR MEMORY DEVICE WITH BUILT-IN ACCESSING SYSTEM FOR REDUNDANT INFORMATION LESS AFFECTING DATA ACCESS SPEED IN STANDARD MODE

[75] Inventor: Yasushi Kato, Tokyo, Japan

[73] Assignee: NEC Corporation, Tokyo, Japan

[21] Appl. No.: 318,387

[22] Filed: Oct. 5, 1994

[30] Foreign Application Priority Data

Oct. 8, 1993 [JP] Japan .................................. 5-275940

[51] Int. Cl.⁶ .............................. G11C 7/00; G11C 29/00
[52] U.S. Cl. .................... 365/200; 365/189.07; 365/195; 365/201; 365/230.03
[58] Field of Search .................................. 365/200, 201, 365/189.09, 230.03, 195, 230.01

[56] References Cited

U.S. PATENT DOCUMENTS 5,383,156  1/1995  Komatsu ............................. 365/200
5,392,247  2/1995  Fujita ................................... 365/200
5,424,989  6/1995  Hagiwara et al. ................... 365/200 X

FOREIGN PATENT DOCUMENTS 3-73500  3/1991  Japan .

*Primary Examiner*—Do Hyun Yoo
*Attorney, Agent, or Firm*—Sughrue, Mion, Zinn, Macpeak & Seas

[57] ABSTRACT

A semiconductor memory device replaces defective regular memory cells with redundant memory cells upon discrimination of an access to the defective regular memory cells. A redundant data accessing unit controls sense amplifiers to produce an information signal indicative of the address of the defective regular memory cell. A redundancy circuit for storing the address allows an output circuit to output the information signal when external address bits are indicative of the address of the defective regular memory cell, thereby making the circuit arrangement simple.

6 Claims, 8 Drawing Sheets

സ5,535,161

SEMICONDUCTOR MEMORY DEVICE WITH BUILT-IN ACCESSING SYSTEM FOR REDUNDANT INFORMATION LESS AFFECTING DATA ACCESS SPEED IN STANDARD MODE

FIELD OF THE INVENTION

This invention relates to a semiconductor memory device with a redundancy and, more particularly, to a semiconductor memory device having a built-in accessing system for redundant information.

DESCRIPTION OF THE RELATED ART

Redundant technologies are applied to a semiconductor memory device and rescue defective products from rejection. A typical example of the redundant technologies is to prepare redundant memory cell groups, and a defective row of regular memory cells or a defective column of regular memory cells is replaced with one of the redundant memory cell group. When the defective row or the defective column is addressed, the addressing system incorporated in the semiconductor memory device automatically changes the defective row or the defective column to the redundant memory cell group, and the redundant memory cell group serves as a data storage instead of the defective row or the defective column replaced therewith. Therefore, the user does not notice the replacement, nor finds the semiconductor memory device inconvenient.

The manufacturer continuously makes an effort to improve in the fabrication technologies for the products and analyzes troubles encountered in the fabrication process. The replacement contains a useful piece of information for the analysis, and the manufacturer tries to access redundant information teaching the replacement stored in the semiconductor memory device.

Japanese Patent Publication of Unexamined Application No. 3-73500 discloses an accessing technology to the redundant information, and FIG. 1 illustrates the prior art built-in accessing system incorporated in the semiconductor memory device.

The built-in accessing system largely comprises a detecting circuit 1A for producing a detecting signal DTC indicative of the replacement of a defective row, a prohibiting circuit 1B for blocking an output pad Dout from a data bit supplied from a sense amplifier circuit (not shown), and a test signal generator 1C for producing a test signal FDE.

While the semiconductor memory device is being subjected to the analysis on the replacement, the test signal generator 1C maintains the test signal FDE in an inactive low level. However, when the semiconductor memory device enters into the test mode, the test signal generator 1C changes the test signal FDE to an active high level. The test signal FDE directly controls the detecting circuit 1A, and the test signal FDE of the inactive low level causes the detecting circuit 1A to enter into high-impedance state. On the other hand, while the test signal FDE is maintained in the active high level, the detecting circuit 1A is responsive to row address predecoded signals B11 ... B1n, ... , B1n, ... and Bnn, and status signals FD1 to FDn indicate whether or not fuse elements are broken for replacing a defective row with a redundant memory cell group. The detecting circuit produces the detecting signal DTC.

The detecting circuit 1A comprises a plurality of NAND gates NA1 to NAn selectively supplied with the row address predecoded signals B11 to Bnn and the status signals FD1 to FDn, an AND gate AN1 coupled to the output nodes of the NAND gates NA1 to NAn, a parallel combination of OR gate OR1 and an AND gate AN2 coupled to the output node of the AND gate AN1, an inverter NOT1 for producing the complementary signal of test signal FDE, and a complementary inverter, i.e., a series combination of a p-channel enhancement type switching transistor TP1 and an n-channel enhancement type switching transistor TN1 coupled between a positive power voltage line Vdd and a ground voltage line GND. The common drain node DN1 of the complementary inverter TP1/TN1 is coupled to the output node Dout.

The prohibiting circuit 1B comprises an inverter NOT2, an AND gate AN3 enabled with an output enable signal OE of the active high level, an OR gate OR2 enabled with the complementary output enable signal COE and a complementary inverter, i.e., a series of a p-channel enhancement type switching transistor TP2 and an n-channel enhancement type switching transistor TN2 coupled between the positive power voltage line Vdd and the ground voltage line GND, and the common drain node DN2 of the complementary inverter TP2/TN2 is coupled to the output pad Dout.

While the semiconductor memory device is out of the test mode, the test signal FDE of the inactive low level and the complementary signal thereof cause the OR gate OR1 and the AND gate AN2 to supply the high level and the low level to the gate electrode of the p-channel enhancement type switching transistor TP1 and the gate electrode of the n-channel enhancement type switching transistor TN1, respectively. Then, the complementary inverter TP1/TN1 enters into the high-impedance state, and the detecting circuit 1A is isolated from the output pad Dout.

The addressing system (not shown) transfers a data bit from regular/redundant memory cells to a sense amplifier (not shown), and the sense amplifier produces a read-out data signal RD indicative of the accessed data bit. The output enable signal OE is changed to the active low level, and the output enable signal OE and the complementary output enable signal COE enable the OR gate OR2 and the AND gate AN3. The OR gate OR2 and the AND gate AN3 are responsive to the read-out data signal RD and cause the p-channel enhancement type switching transistor TP2 and the n-channel enhancement type switching transistor TN2 to complementarily turn on and off for transferring the read-out data signal RD to the output pad Dout.

When the test signal generator 1C changes the test signal FDE to the active high level, the AND gate AN2 and the OR gate OR1 are enabled with the test signal FDE and the complementary signal thereof. An analyzer (not shown) sequentially changes the row address represented by the row address signal, and the sets of row address predecoded signals B11–B1n, . . . and B1n–Bnn are sequentially changed to the high level. If a defective row is replaced with a redundant memory cell group, the fuse elements of the redundant circuit are broken, and the status signals FD1 to FDn are changed to the high level during access to the defective row. This results in the input nodes of one of the NAND gates NA1 to NAn being changed to the high level, and the NAND gate changes the output node thereof to the low level. Then, the NAND gate AN1 changes the output node thereof to the low level, and the OR gate OR1 and the AND gate AN2 change the output nodes thereof to the low level. As a result, the complementary inverter TP1/TN1 couples the positive power voltage line Vdd to the output pad Dout, and the analyzer determines the row address of the defective row of regular memory cells. While the semiconductor memory device is being subjected to the analysis, the prohibiting circuit 1B does not transfer the read-out data signal RD to the output pad Dout.

The prior art built-in accessing system encounters a problem in that the detecting circuit 1A decelerates an access speed in the standard mode due to a parasitic capacitance of the complementary inverter TP1/TN1.

The second problem encountered in the prior art built-in accessing system is the large amount of real estate occupied by the NAND gates NA1 to NAn and the AND gate AN1.

SUMMARY OF THE INVENTION

It is therefore an important object of the present invention to provide a semiconductor memory device which is simple and does not decelerate an access speed in a standard mode.

To accomplish the object, the present invention proposes to cause a redundancy unit to determine the logic level of an output signal of a sense amplifier unit.

In accordance with the present invention, there is provided a semiconductor memory device having at least a regular data access sequence for data bits and a redundant data access sequence for redundant data, comprising: a) a regular memory cell array having a plurality of regular memory cells for storing the data bits, the plurality of regular memory cells being divided into a plurality of regular memory cell groups; b) a plurality of redundant memory cells for storing selected data bits of the data bits, at least one of the plurality of regular memory cell groups being replaceable with the plurality of redundant memory cells; c) an addressing system coupled to the regular memory cell array and the plurality of redundant memory cells and responsive to external address bits for selectively transferring the data bits to an output port thereof in the regular data access sequence, the addressing system blocking the output port from the data bits in the redundant data access sequence; d) a sense amplifier unit associated with the regular memory cell array and the plurality of redundant memory cells, and operative to discriminate the logic level of each data bit selectively transferred to the output port in the regular data access sequence; e) a redundant data accessing unit enabled with a test signal indicative of a request for the redundant data access sequence, and producing an information signal indicative of the redundant data in cooperation with the sense amplifier unit in the redundant data access sequence; f) a redundancy unit storing the redundant data, and operative to discriminate an access to the at least one of the plurality of regular memory cell groups for selectively outputting the selected data bits instead of the data bits supplied from the at least one of the plurality of regular memory cell groups in the regular data access sequence, the redundant unit being further operative to determine the logic level of the information signal in the redundant data access sequence; and g) an output circuit operative to selectively output the data bits in the regular data access sequence and to output a diagnostic signal indicative of the logic level of the information signal in the redundant data access sequence.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
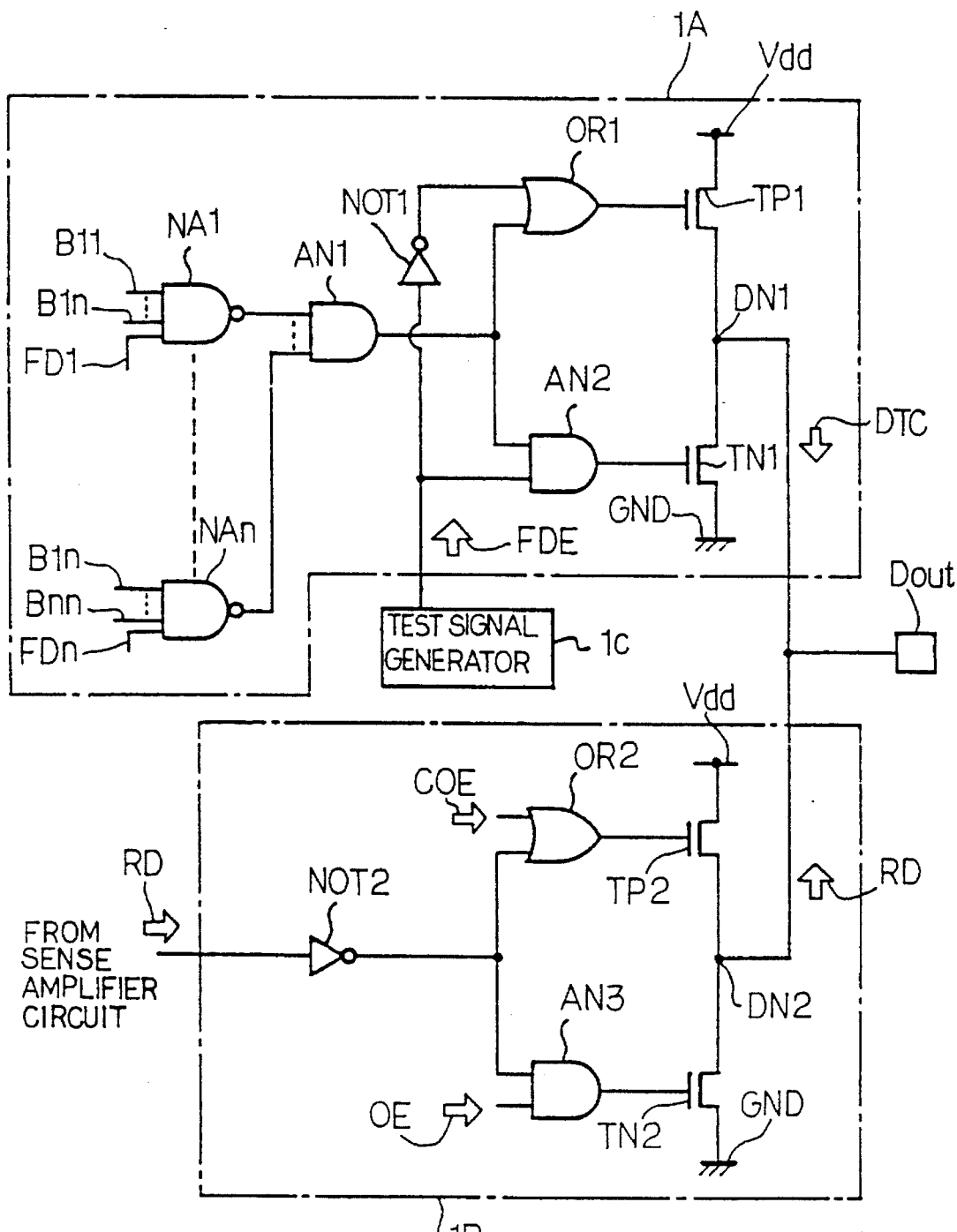
FIG. 1 is a circuit diagram showing the prior art built-in accessing system for the redundant information stored in the semiconductor memory device.
Figure 2:
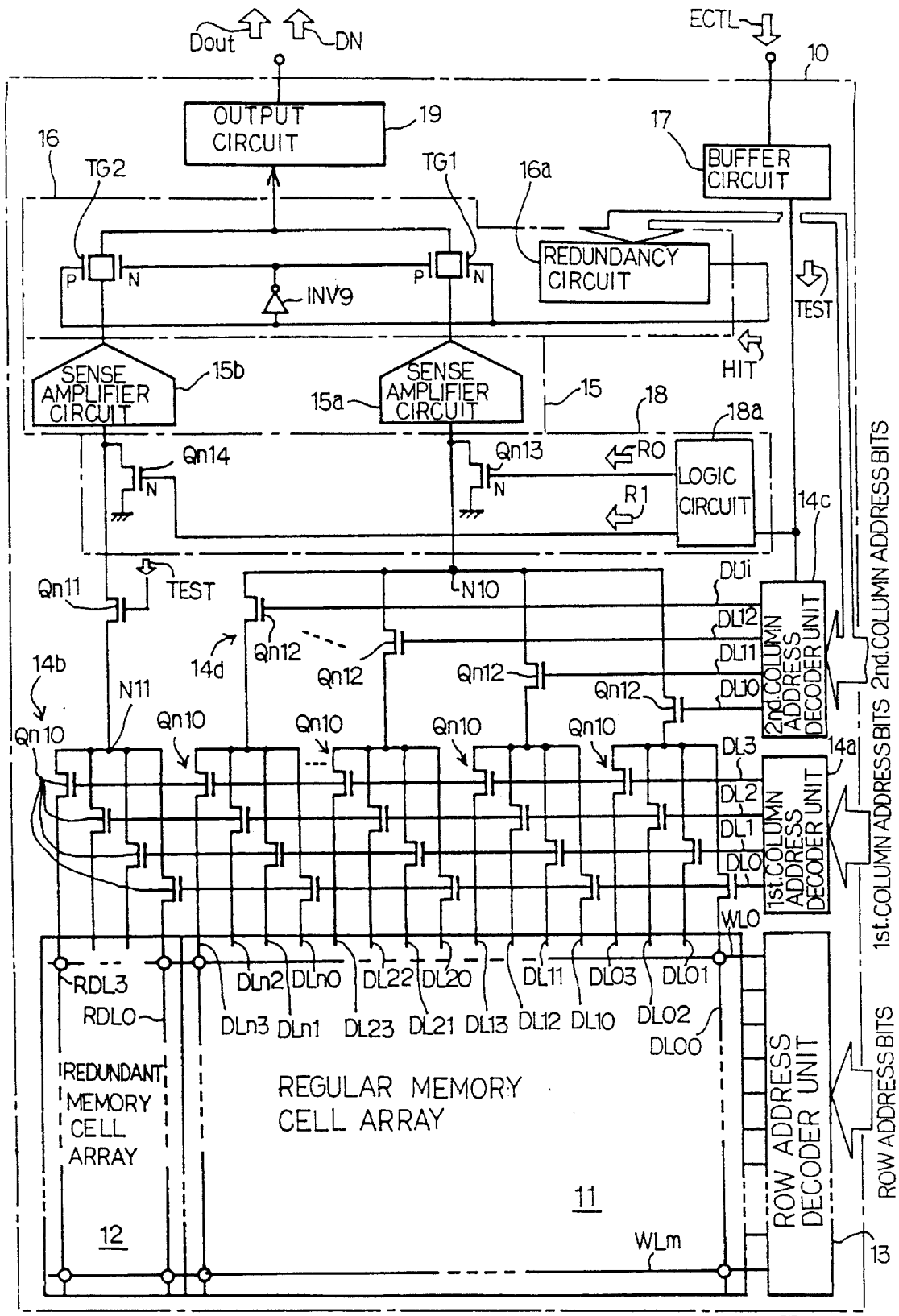
FIG. 2 is a circuit diagram showing the arrangement of a semiconductor memory device according to the present invention.

Referring to FIG. 2 of the drawings, a semiconductor memory device embodying the present invention is fabricated on a Semiconductor chip 10, and selectively enters into a standard mode for accessing stored data bits and a test mode for accessing address information indicative of an address of a defective column of regular memory cells replaced with a column of redundant memory cells. A sequence for accessing the stored data bits is the regular data access sequence, and the address information is accessed through a redundant data access sequence.

The semiconductor memory device comprises a regular memory cell array 11 implemented by a plurality of regular memory cells arranged in rows and columns and a redundant memory cell array 12 also implemented by a plurality of redundant memory cells arranged in rows and columns. The regular memory cells and the redundant memory cells are indicated by small circles in FIG. 2 and can store data bits, respectively. In this instance, the stored data bit is represented by whether or not the memory cell produces a conductive channel during a data access, and the regular and redundant memory cells are coupled between the associated regular and redundant data propagation paths and a discharging line (not shown). A mask ROM cell, an EPROM (Electrically Programmable Read Only Memory) cell and an EEPROM (Electrically Erasable and Programmable Read Only Memory) cell are the type storing a data bit as a Conductive channel.

A plurality of word lines WL0 to WLm are shared between the regular memory cell array 11 and the redundant memory cell array 12 and is coupled to the rows of regular memory cells and the rows of redundant memory cells for selecting one of the rows of regular memory cells and one of the rows of redundant memory cells. Row addresses are respectively assigned to the plurality of word lines WL0 to WLm and are selected by row address bits supplied from the outside of the semiconductor memory device.

A plurality of regular data propagation paths DL00–DL03, DL10–DL13, DL20–DL23 and DLn0–DLn3 are provided for the columns of regular memory cells, and a plurality of redundant data propagation paths RDL0 to RDL3 are respectively associated with the columns of redundant memory cells. When one of the word lines WL0 to WLm are energized to an active level, the regular memory cells of the associated row and the redundant memory cells of the associated row are concurrently coupled to the regular data propagation paths DL00–DL03, DL10–DL13, DL20–DL23 and DLn0–DLn3 and the redundant data propagation paths RDL0–RDL3, and the selected regular/redundant memory cells are examined whether or not the conductive channel take place between the associated regular/redundant data propagation paths and the discharging line.

In this instance, every four regular data propagation paths are grouped, and, accordingly, the plurality of regular data propagation paths are divided into regular data propagation path groups. First column addresses are respectively assigned to the four regular data propagation paths of each regular data propagation group, and first column address bits selects a regular data propagation path from every regular data propagation group.

The first column addresses are further assigned to the redundant data propagation paths, respectively, and the first column address bits also selects one of the redundant data propagation paths.

The regular data propagation path groups are respectively assigned second column addresses, and second column address bits select one of the regular data propagation path groups.

The semiconductor memory device further comprises an addressing system largely broken down into a row addressing sub-system and a column addressing sub-system. The row addressing sub-system is implemented by a row address decoder unit 13, and the row address bits are supplied to the row address decoder unit 13. The row address decoder unit 13 energizes one of the word lines WL0 to WLm assigned the row address indicated by the row address bits.

The column addressing sub-system comprises a first column address decoder unit 14a, a first column selectors 14b implemented by arrays of n-channel enhancement type switching transistors Qn10 and four decoded signal lines DL0 to DL3. The first column address decoder unit 14a energizes one of the four decoded signal lines DL0 to DL3 on the basis of the first column address bits. The arrays of n-channel enhancement type switching transistors Qn10 are associated with the regular data propagation path groups DL00–DL03, DL10–DL13, DL20–DL23 and DLn0–DLn3 and the redundant data propagation paths RDL0–RDL3, and the n-channel enhancement type switching transistors Qn10 of each array are coupled to the four regular data propagation paths of the associated group DL00–DL03/DL10–DL13/DL20–DL23/DLn0–DLn3 or the redundant data propagation paths RDL0–RDL3. Each of the decoded signal lines DL0–DL3 is coupled to one of the n-channel enhancement type switching transistors Qn10 of each array, and the first column address decoder unit 14a causes one of the n-channel enhancement type switching transistors Qn10 of each array to turn on.

Figure 3:
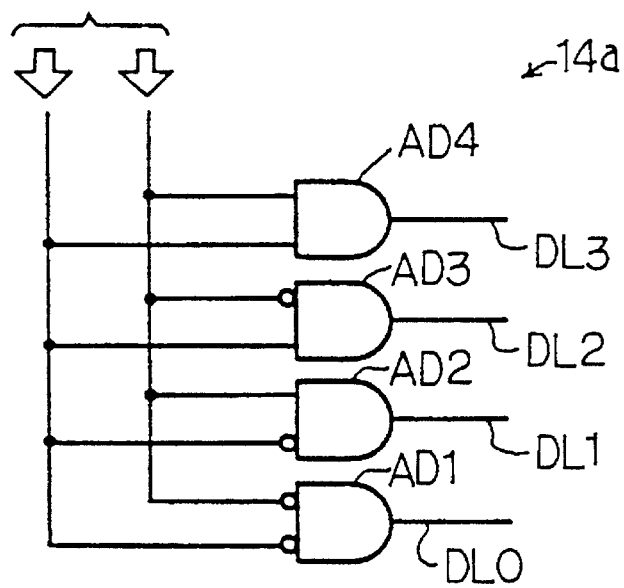
FIG. 3 is a logic diagram showing the arrangement of a first column address decoder unit incorporated in the semiconductor memory device.

In this instance, the first column address decoder unit 14a comprises four AND gates AD1, AD2, AD3 and AD4 and inverter selectively coupled to the input nodes of the AND gates AD1 to AD4 as shown in FIG. 3. Small circles are indicative of the inverters coupled to the input nodes of the AND gates AD1 to AD4. The first column address bits are supplied directly to the input nodes of the AND gates AD1 to AD4 and through the inverters to the input nodes of the AND gates AD1 to AD4. The decoded signal lines DL0 to DL3 are respectively coupled to the output nodes of the AND gates AD1 to AD4, and only one of the AND gates AD1 to AD4 changes the associated decoded signal line to an active high level depending on the combination of the logic levels of the first column address bits.

Turning back to FIG. 2 of the drawings, the column addressing sub-system further comprises a second column address decoder unit 14c, a second column selector unit 14d and an n-channel enhancement type transfer transistor Qn11 coupled to the output node of the array of n-channel enhancement type switching transistors Qn10 associated with the redundant memory cell array 12.

The second column selector unit 14d is implemented by a plurality of n-channel enhancement type switching transistors Qn12 coupled to the output nodes of the respective arrays of n-channel enhancement type switching transistors Qn10 assigned to the regular memory cell array 11. A plurality of decoded signal lines DL10 to DL1i are respectively coupled to the gate electrodes of the n-channel enhancement type switching transistors Qn12, and the second column address decoder unit 14c energizes one of the decoded signal lines DL10 to DL1i to an active high level.

Figure 4:
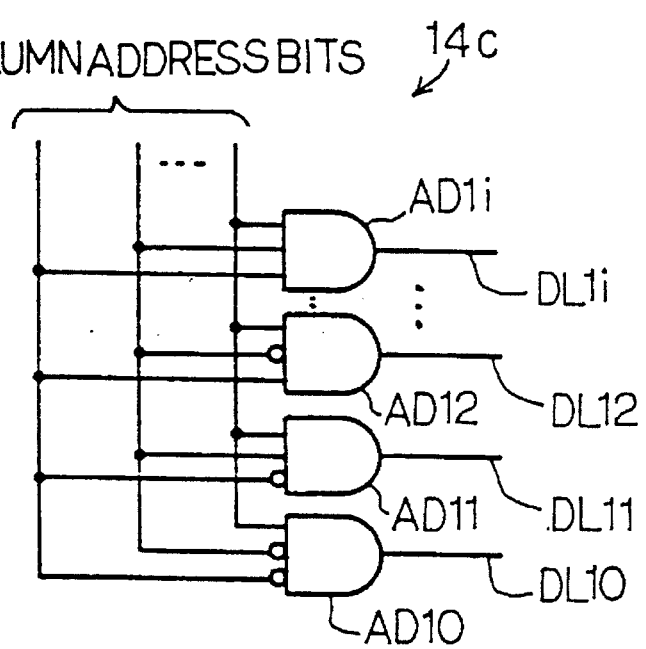
FIG. 4 is a logic diagram showing the arrangement of a second column address decoder unit incorporated in the semiconductor memory device.

As shown in FIG. 4, the second column selector unit 14c comprises a plurality of AND gates AD10 to AD1i and inverters selectively coupled to the input nodes of the AND gates AD10 to AD1i, and the inverters are represented by small circles in FIG. 4. The second column address bits are supplied directly to the input nodes of the AND gates AD10 to AD1i and through the inverters to the other input nodes of the AND gates AD10 to AD1i. Only one of the AND gates AD10 to AD1i changes the associated decoded signal line to the active high level depending upon the combination of the logic levels of the second column address bits. The decoded signal line energized by the second column address decoder unit 14c allows the associated n-channel enhancement type switching transistor Qn12 to turn on, and only one of the regular data propagation paths DL00 to DLn3 is electrically coupled through the first and second column selector units 14b and 14d to a common source node N10 of the n-channel enhancement type switching transistors Qn12.

Turning back to FIG. 2 of the drawings, the n-channel enhancement type transfer transistor Qn11 is coupled to a common source node N11 of the n-channel enhancement type switching transistors Qn10 associated with the redundant data propagation paths RDL0 to RDL3, and a test signal TEST is supplied to the gate electrode of the n-channel enhancement type transfer transistor Qn11. As will be described in detail hereinbelow, the test signal TEST is maintained in the high level in the standard mode, and the n-channel enhancement type switching transistor Qn11 is turned on for transferring a data bit therethrough.

The semiconductor memory device further comprises a sense amplifier unit 15, and the sense amplifier unit 15 is implemented by two current-mirror type amplifier circuits 15a and 15b. Though not shown in FIG. 2, the current-mirror type amplifier circuits 15a and 15b are coupled to a positive power voltage line, and supply currents to the common source nodes N10 and N11. In the standard mode, the first and second column-selector units 14b and 14d select one of the regular data propagation paths DL00 to DLn3 and one of the redundant data propagation paths RDL0 to RDL3, and the currents flow into the selected regular data propagation path and the selected redundant data propagation path, respectively.

The semiconductor memory device further comprises a redundancy unit 16 for replacing one of the regular memory cell groups with the columns of redundant memory cells. The redundancy unit 16 comprises a redundancy circuit 16a, an inverter INV9 and two transfer gates TG1 and TG2, and second column address bits are supplied to the redundancy circuit 16a.

Figure 5:
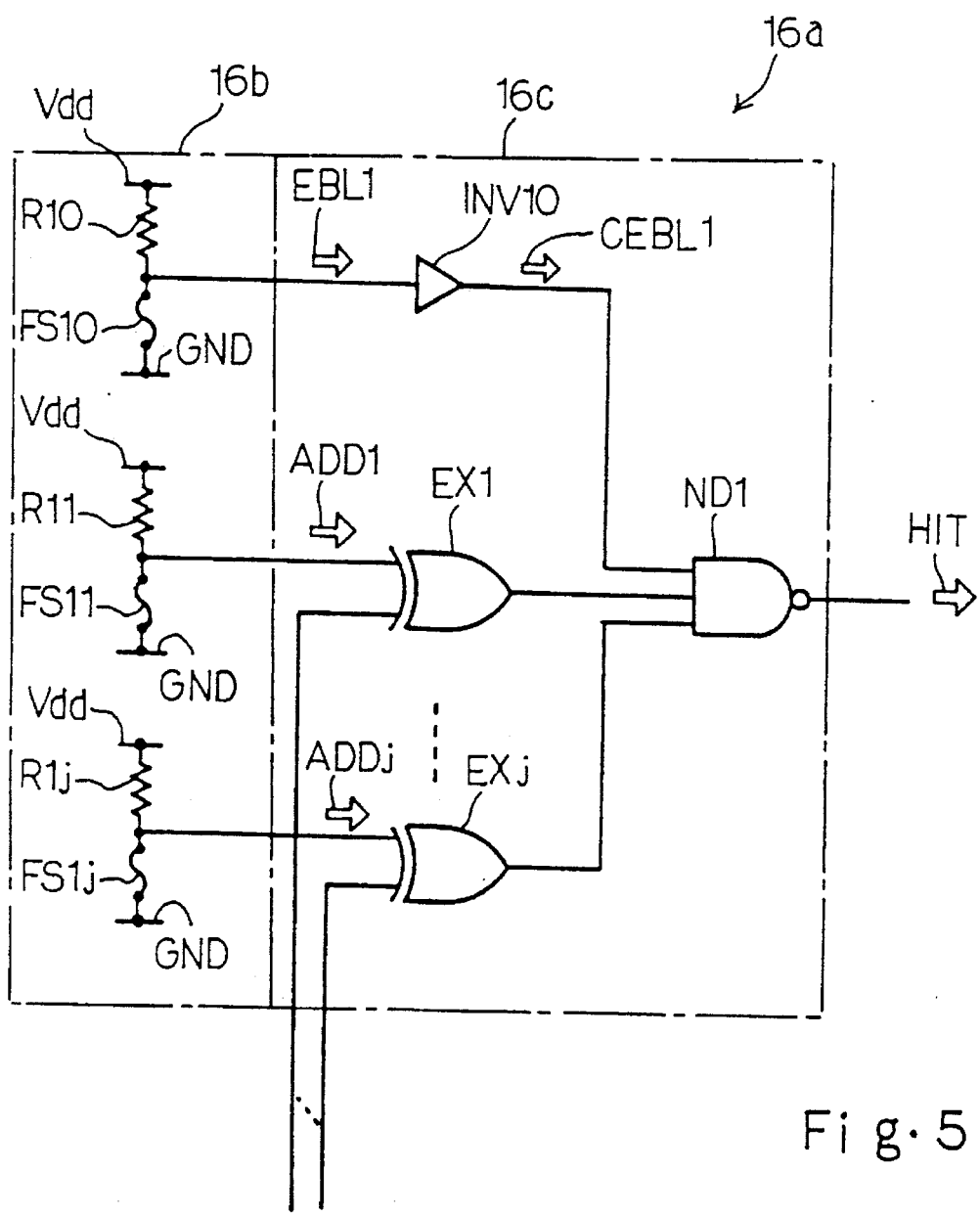
FIG. 5 is a logic diagram showing the arrangement of a redundant circuit incorporated in the semiconductor memory device.

As shown in FIG. 5, the redundancy circuit is broken down into a memory section 16b and a comparator section 16c. A plurality of series circuits of resistors R10/R11/ . . . /R1j and fuse elements FS10/FS11/ . . . /FS1j form the memory section 16b, and are coupled between the positive power voltage line Vdd and the ground voltage line GND.

When all of the regular memory cell groups are excellent, the fuse element FS10 is broken, and the associated resistor R10 produces an enable signal EBL1 of the high level indicative of non-replacement. On the other hand, if one of the regular memory cell groups contains a defective regular memory cell, the regular memory cell group is replaced with the columns of redundant memory cells, and the fuse element is not broken. As a result, the associated resistor R10 produces the enable signal EBL1 of the low level indicative of the replacement with the columns of redundant memory cells.

The fuse elements FS11 to FS1j are selectively broken for storing one of the second column addresses. A broken fuse element is indicative of an address bit of logic "1" level, and a non-broken fuse element stands for an address bit of logic "0" level. If a bit string "1 . . . 0" is indicative of the second column address assigned to the regular memory cell group replaced with the columns of redundant memory cells, the fuse element FS11 is broken, and the fuse element FS1j is not broken. Then, the associated resistors R11 to R1j produce an address bit ADD1 of logic "1" level to an address bit ADDj of logic "0" level.

The comparator section comprises an inverter INV10 for producing the complementary enable signal CEBL1, a plurality of exclusive-OR gates EX1 to EXj for comparing the address bits ADD1 to ADDj with the second column address bits and a NAND gate ND1 enabled with the complementary enable signal CEBL1 for producing a hit signal HIT. When all of the address bits ADD1 to ADDj are matched with the second column address bits, the NAND gate ND1 changes the hit signal HIT to the low level. However, if all of the regular memory cell groups are excellent or the second column address is not matched with the address stored in the memory section 16b, the NAND gate ND1 maintains the hit signal HIT to the high level.

Turning back to FIG. 2 of the drawings, the hit signal HIT is supplied to the inverter INV9 for producing the complementary hit signal. Each of the transfer gates TG1 and TG2 is implemented by a parallel combination of a p-channel enhancement type switching transistor and an n-channel enhancement type switching transistor, and the hit signal HIT and the complementary hit signal are selectively supplied to the gate electrodes of these switching transistors so that the transfer gates TG1 and TG2 complementarily turn on and off.

The semiconductor memory device further comprises a buffer circuit 17 for storing an external control signal ECTL indicative of the test mode, and the buffer circuit 17 produces the test signal TEST of the active low level from the external control signal ECTL.

Figure 6:
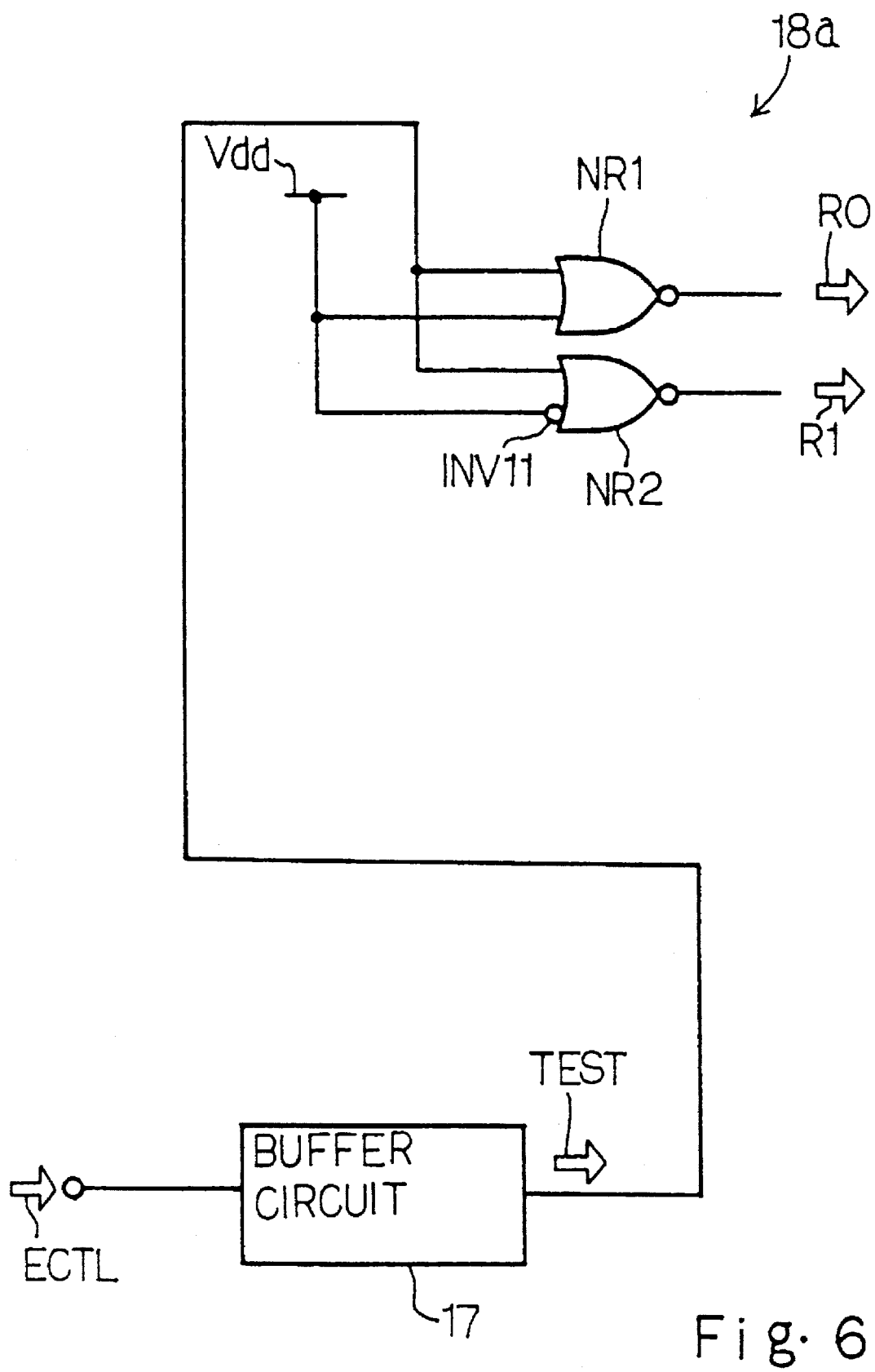
FIG. 6 is a logic diagram showing the arrangement of a logic circuit of a redundant data accessing system incorporated in the semiconductor memory device.

The semiconductor memory device further comprises a redundant data accessing unit 18, and the redundant data accessing unit 18 has a logic circuit 18a and n-channel enhancement type discharging transistors Qn13 and Qn14. As shown in FIG. 6, the logic circuit 18a comprises NOR gates NR1 and NR2 and an inverter INV11 coupled to one of the input nodes of the NOR gate NR2. The positive power voltage level equivalent to logic "1" level is supplied to one of the input node of the NOR gate NR1 and the inverter INV11, and the test signal TEST is supplied to the other input nodes of the NOR gates NR1 and NR2.

While the semiconductor memory device is operating in the standard mode, the NOR gates maintain gate control signals R0 and R1 in the low level. However, when the semiconductor memory device enters into the test mode, the NOR gate NR1 keeps the gate control signal R0 in the low level, and the other NOR gate NR2 changes the gate control signal R1 to the high level.

Turning back to FIG. 2 of the drawings, the n-channel enhancement type discharging transistors Qn13 and Qn14 are coupled between the input nodes of the sense amplifier circuits 15a and 15b and the discharging line. In the standard mode, the gate control signals R0 and R1 allow the n-channel enhancement type discharging transistors Qn13 and Qn14 to be turned off, and the currents are supplied from the sense amplifier circuits 15a and 15b to the regular memory cell array 11 and the redundant memory cell array 12. However, the gate control signal R1 causes the n-channel enhancement type discharging transistor Qn14 to turn on in the test mode, and the current is discharged to the discharge line.

The semiconductor memory device further comprises an output circuit 19 coupled to the transfer gates TG1 and TG2, and produces an output data signal Dout indicative of the accessed data in the standard mode and a diagnostic signal DN indicative of the match between the second column address and the address stored in the memory section 16b.

Assuming now that the rightmost regular memory cell group has been replaced with the columns of redundant memory cells, an analyst starts the analysis by connecting the semiconductor memory device with an analyzer (not shown). The analyzer supplies the external control signal ECTL to the buffer circuit 17, and the test signal TEST of the low level causes the second column address decoder unit 14c not to respond to the second column address bits. In other words, the second column selector unit 14d electrically isolates the regular memory cell array 11 from the sense amplifier circuit 15a. Moreover, the logic circuit 18a supplies the gate control signal R1 to the n-channel enhancement type discharging transistor Qn14, and allows the transistor Qn14 to turn on. The test signal TEST of the low level causes the n-channel enhancement type switching transistor Qn11 to turn off, and the n-channel enhancement type switching transistor Qn11 electrically isolates the redundant memory cell array 12 from the sense amplifier circuit 15b.

The sense amplifier circuits 15a and 15b supply currents to the n-channel enhancement type discharging transistors Qn13 and Qn14. The n-channel enhancement type discharging transistor Qn14 discharges the current, and the sense amplfiier circuit 15b changes the output node thereof to the high level. On the other hand, the n-channel enhancement type discharging transistor Qn13 is turned off, and the current is not discharged. As a result, the sense amplifier circuit 15a maintains the output node thereof to the low level. Thus, the sense amplifier circuits 15a and 15b complementarily set the output nodes thereof.

The analyzer sequentially changes the second column address bits, and the comparator section 16c compares the second column address thus sequentially incremented with the address stored in the memory section 16b. While the second column address is not matched with the stored address, the comparator section 16c maintains the hit signal HIT in the high level, and the transfer gate TG1 turns on. However, the other transfer gate TG2 is turned off. As a result, the low level of the information signal is transferred from the output node of the sense amplfiier circuit 15a through the transfer gate TG1 to the output circuit 19, and the output circuit 19 supplies the disanostic signal DN of the low level indicative of the mis-match.

When the second column address is matched with the stored address, the comparator section 16c changes the hit signal HIT to the low level, and the transfer gate TG2 turns on. However, the other transfer gate TG1 turns off. Then, the information signal of the high level is transferred from the output node of the sense amplifier circuit 15b to the output circuit 19, and the output circuit changes the disgnotic signal DN to the high level indicative of the match between the second column address and the stored address.

The analyzer determines the second column address assigned to the regular memory cell group replaced with the columns of redundant memory cells on the basis of the second column address bits at the change of the disgnostic signal DN.

If the semiconductor memory device is installed in an electronic system, the semiconductor memory device behaves as follows. The buffer circuit 17 keeps the test signal TEST in the high voltage level, and the second column address decoder unit 14c is enabled with the test signal TEST. The test signal TEST of the high level causes the n-channel enhancement type switching transistor Qn11 to turn on, and the redundant memory cell array 12 is electrically connected throgh the first column selector unit 14b and the n-channel enhancement type switching transistor Qn11 to the sense amplfiier circuit 15b. The logic circuit 18a keeps the gate control signal R0 and R1 in the low level, and the n-channel enhancement type discharging transistors Qn13 and Qn14 are turned off.

While an external device is accessing to the data bits stored in the regular memory cell array 11 except for the rightmost regular memory cell group, the row address decoder unit 13 energizes one of the word lines WL0 to WLm, and the associated regular memory cells and the associated redundant memory cells selectively turn on and off depending upon the data bits stored therein. The first and second column address decoder units 14a and 14c electrically couples the sense amplifier circuits 15a and 15b to one of the regular data propagation paths DL00 to DLn3 and to one of the redundant data propagation paths RDL0 to RDL3. If the selected regular/redundant memory cells produce the conductive channel, the regular/redundant data propagation paths are decayed in voltage level, and the sense amplifier circuits 15a and 15b changes the output nodes thereof to the high level. The second column address is not matched with the stored address, and the hit signal of the high level allows only the transfer gate TG1 to turn on. As a result, the voltage level at the output node of the sense amplifier circuit 15a is transferred to the output circuit 19, and the output circuits 19 produces the output data signal Dout indicative of the accessed data bit.

If, on the other hand, the external device accesses the data bit stored in the rightmost regular memory cell group, the second column address is matched with the stored address, and the comparator section 16c changes the hit signal HIT to the low level. Then, the transfer gate TG1 turns off, and the other transfer gate TG2 turns on. As a result, the voltage level at the sense amplifier circuit 15b is transferred through the transfer gate TG2 to the output circuit 19, and the output circuit 19 produces the output data signal Dout indicative of the data bit stored in the redundant memory cell array 12.

As will be appreciated from the foregoing description, the two n-channel enhancement type discharging transistors Qn13 and Qn14 controlled by the logic circuit 18a cause the sense amplifier circuits 15a and 15b to supply the information signal to the output circuit 19 in cooperation with the redundancy unit 16. The redundant data accessing unit 18 is simpler in arrangement than that of the prior art semiconductor memory device. The output circuit 19 is not expected to drive an addition parasitic capacitance, and the access speed is improved.

Second Embodiment

Figure 7:
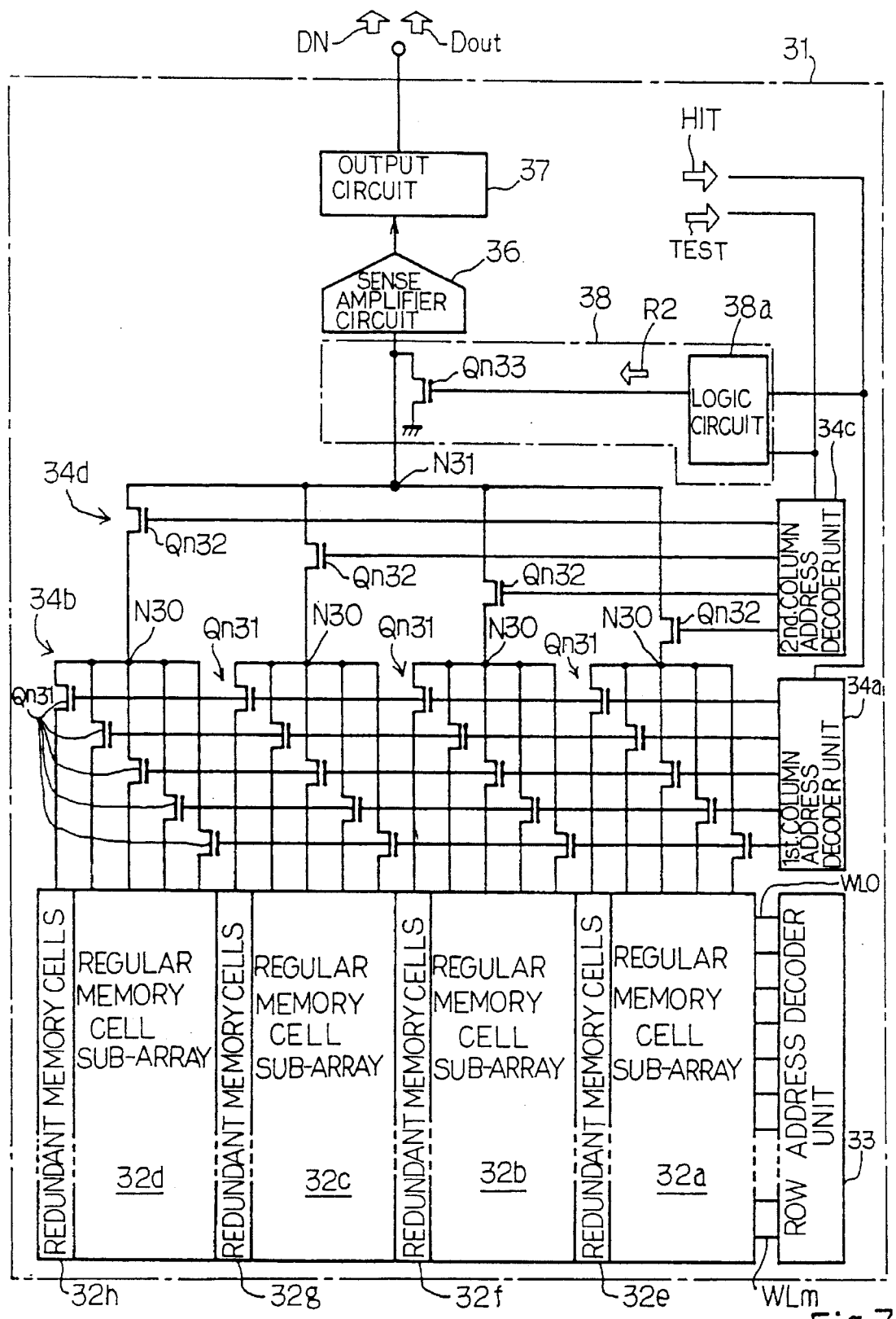
FIG. 7 is a block diagram showing the arrangement of another semiconductor memory device according to the present invention.

Turning to FIG. 7 of the drawings, another semiconductor memory device is fabricated on a single semiconductor chip 31 and has a standard mode for the regular data access sequence and a test mode for the redundant data access sequence.

The semiconductor memory device comprises a regular memory cell array broken down into a plurality of regular memory cell sub-arrays 32a, 32b, 32c and 32d each arranged in rows and columns, and columns of redundant memory cells 32e, 32f, 32g and 32h are respectively associated with the regular memory cell sub-arrays 32a to 32d. The regular memory cells and the redundant memory cells are similar to those of the first embodiment. Word lines WL0 to WLm are shared between the regular memory cell sub-arrays 32a to 32d and the columns of redundant memory cells 32e to 32h. Regular data propagation paths are coupled to the columns of regular memory cells, respectively, and redundant data propagation paths are respectively coupled to the redundant data propagation paths, respectively. The regular memory cell dub-arrays 32a to 32d and the associated columns of redundant memory cells form a plurality of combined memory cell arrays.

The semiconductor memory device further comprises an addressing system largely broken down into a row addressing sub-system and a column-addressing sub-system.

The row addressing sub-system is implemented by a row address decoder unit 33, and the row address decoder unit 33 is responsive to row address bits for selectively energizing word lines WL0 to WLm.

The column address sub-system comprises a first column address decoder unit 34a, a first column selector unit 34b, a second column address decoder unit 34c and a second column selector unit 34d.

The first column address decoder unit 34a is responsive to first column address bits for selectively driving decoded signal lines, and the driving decoded signal lines selects one of the column of regular/redundant memory cells from each combined memory cell array.

Figure 8:
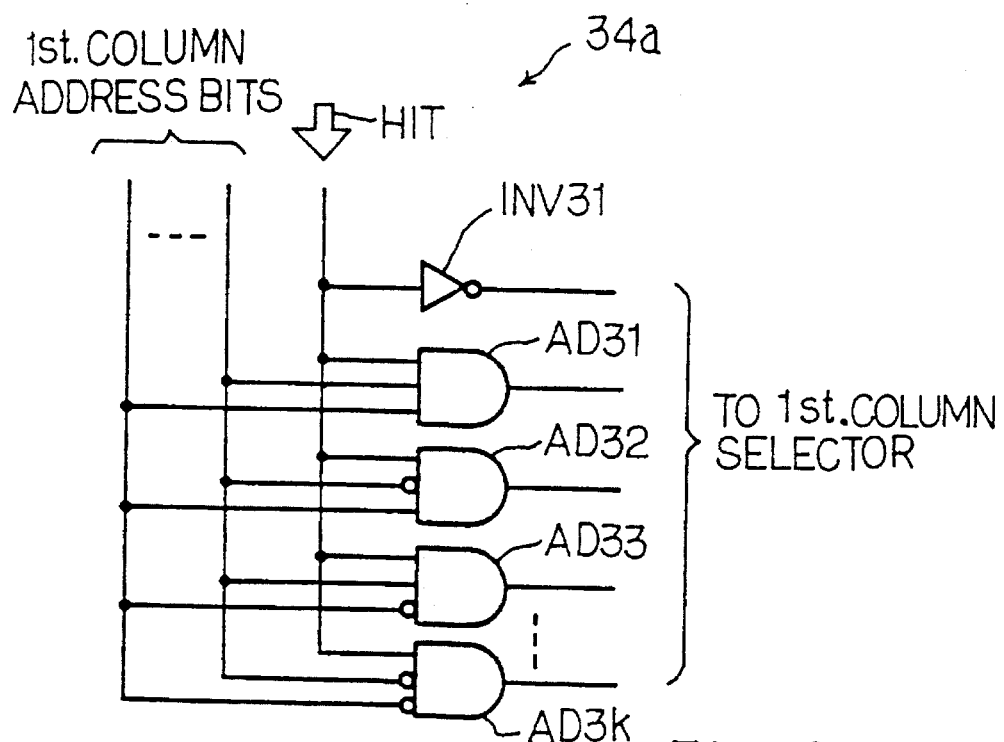
FIG. 8 is a logic diagram showing the arrangement of a first column address decoder unit incorporated in the semiconductor memory device.
Figure 9:
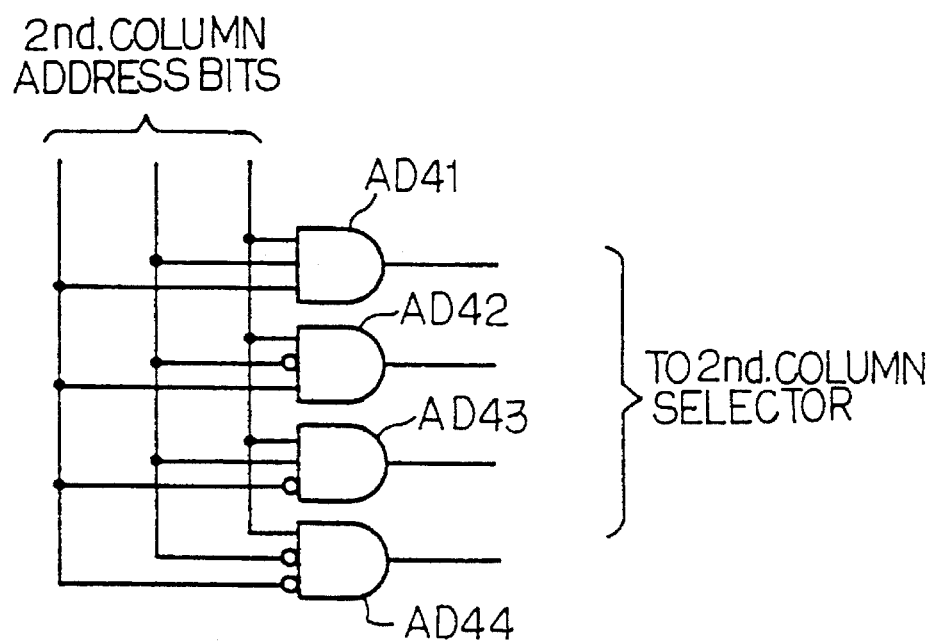
FIG. 9 is a logic diagram showing the arrangement of a second column address decoder unit incorporated in the semiconductor memory device.

The arrangement of the first column address decoder unit 34a is shown in FIG. 8, and comprises a plurality of AND gates AD31, AD32, AD33 and AD3k and inverters selectively coupled to the input nodes of the AND gates AD31 to AD3k and represented by small circles. An inverter INV31 is associated with the first column address decoder unit 34a, and the inverter INV31 and the AND gates AD31 to AD3k are coupled to decoded signal lines. The decoded signal lines are selectively coupled to gate electrodes of n-channel enhancement type switching transistors Qn31 forming in combination the first column selector unit 34b, and cause the first column selector unit 34b to couple common source nodes N30 to the columns of regular/redundant memory cells.

Figure 10:
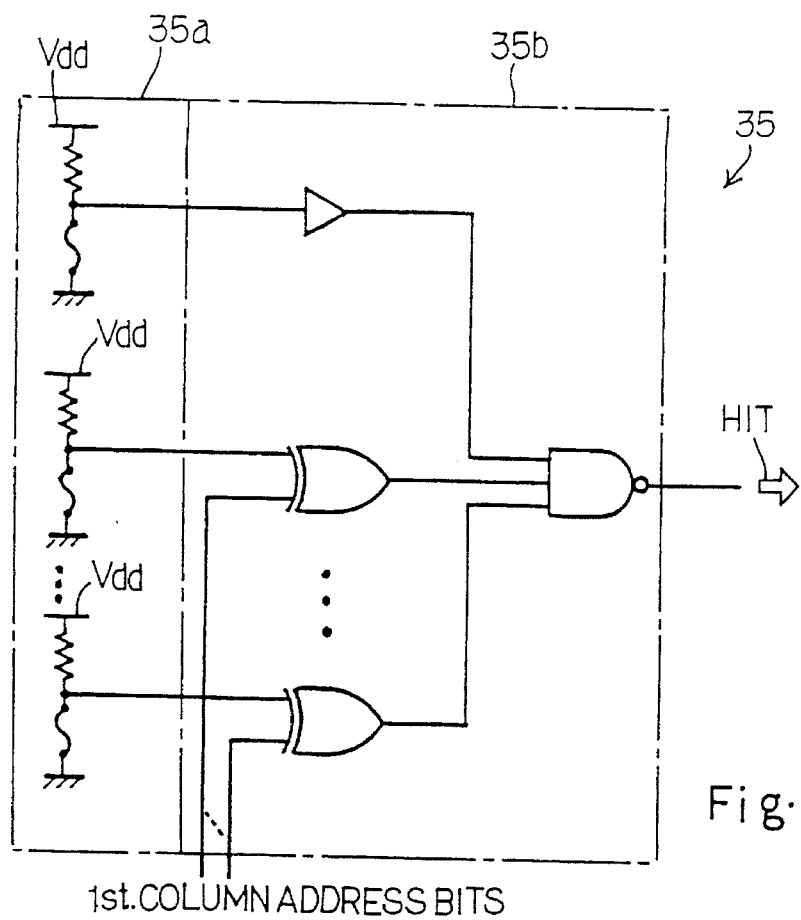
FIG. 10 is a logic diagram showing the arrangement of a redundant circuit incorporated in the semiconductor memory device.

A hit signal HIT of an active low level is supplied from a redundant circuit 35 (see FIG. 10) to the inverter INV31, and the inverter INV31 energizes the decoded signal line for selecting the columns of redundant memory cells 32e to 32h. The hit signal HIT is further supplied to the AND gates AD31 to AD3k, and the hit signal HIT of the active level disables the AND gates AD31 to AD3k.

On the other hand, the hit signal HIT of an inactive high level enables the AND gates AD31 to AD3k, and allows the AND gates AD31 to AD3k to respond to the first column address bits for selectively energizing the associated decoded signal lines. However, the hit signal HIT of the inactive high level does not cause the inverter INV31 to energize the associated decoded signal line. Thus, the first column address decoder unit 34a replaces the regular memory cell sub-arrays 32a to 32d with the columns of redundant memory cells 32e to 32h depending upon the hit signal HIT.

The second column address decoder unit 34c is implemented by AND gates AD41 to AD44 and inverters selectively coupled to the input nodes of the AND gates AD41 to AD44 and represented by small circles. The second column address bits are supplied directly to the input nodes of the AND gates AD41 to AD44 and through the inverters to the input nodes of the AND gates AD41 to AD44, and decoded signal lines are respectively coupled to the output nodes of the AND gates AD41 to AD44.

Turning back to FIG. 7, the second column selector unit 34d is implemented by an array of n-channel enhancement type switching transistors Qn32 respectively gated by the decoded signal lines, and the first column selector unit 34b and the second column selector unit 34d electrically couples a common source node N31 to one of the columns of regular/redundant memory cells.

The common source node N31 is coupled to a sense amplifier circuit 36 of a current mirror type, and the sense amplifier circuit 36 supplies current to the common source node N31. The current passes through the second column selector unit 34d and the first column selector unit 34b, and flows into the selected column of regular/redundant memory cells.

The sense amplifier circuit 36 quickly discriminates the voltage level on the source node N31, and causes an output circuit 37 to produce a diagnostic signal DN or an output data signal Dout.

The semiconductor memory device further comprises the redundant circuit 35 (see FIG. 10), and the redundant circuit 35 and the inverter INV31 form a redundant unit in this instance. The redundant circuit 35 is broken down into a memory section 35a and a comparator section 35b, and the memory section 35a and the comparator section 35b are similar in circuit configuration to those of the first embodiment. For this reason, no further description is incorporated hereinbelow.

Figure 11:
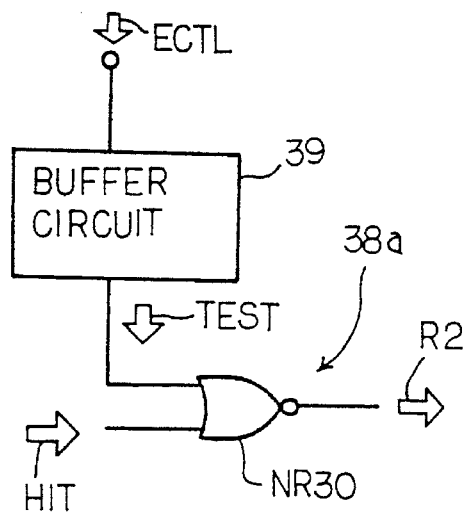
FIG. 11 is a logic diagram showing a logic circuit incorporated in the semiconductor memory device for producing a gate control signal.

The semiconductor memory device further comprises a redundant data accessing unit 38, and the redundant data accessing unit 38 has a logic circuit 38a and an n-channel enhancement type discharging transistor Qn33 coupled between the sense amplifier circuit 36 and a discharging line. As shown in FIG. 11, the logic circuit 38a is implemented by a NOR gate NR30, and a test signal TEST is supplied from a buffer circuit 39 to one of the input nodes of the NOR gate NR30. The hit signal HIT is supplied to the other input node of the NOR gate NR30, and the NOR gate NR30 produces a gate control signal R2 for controlling the n-channel enhancement type discharging transistor Qn33.

The buffer circuit 39 produces the test signal TEST from an external control signal ECTL indicative of a request for an access to the redundant data stored in the memory section 35a. While the semiconductor memory device is operating in the standard mode, the test signal TEST remains in the high level. When the external control signal ECTL is supplied to the buffer circuit 39, the test signal TEST is changed to the low level, and the NOR gate NR30 is enabled with the test signal TEST.

In the redundant data access sequence, an analyzer (not shown) supplies the external control signal ECTL, and sequentially changes the first column address indicated by the first column address bits. While the address stored in the memory section 35a is different from the first column address, the comparator section 35b maintains the hit signal HIT in the high level, and the NOR gate NR30 supplies the gate control signal of the inactive low level. The n-channel enhancement type discharging transistor Qn33 is turned off, and the sense amplifier circuit 36 causes the output circuit 37 to keep the diagnostic signal DN in a low level.

When the first column address is matched with the stored address, the comparator section 35b changes the hit signal HIT to the low level, and the NOR gate NR30 supplies the gate control signal R2 of the active high level to the n-channel enhancement type discharging transistor Qn33. The n-channel enhancement type discharging transistor Qn33 turns on, and pulls down the voltage level at the common source node N31. The sense amplifier circuit 36 causes the output circuit 37 to change the diagnostic signal DN to the high level, and the analyzer determines the first column address of the defective column of regular memory cells.

Although particular embodiments of the present invention have been shown and described, it will be obvious to those skilled in the art that various changes and modifications may be made without departing from the spirit and scope of the present invention. For example, the redundant data accessing system according to the present invention is applicable to a volatile memory device such as a random access memory device in so far as at least one sense amplifier circuit is incorporated therein. Moreover, the test mode signal may be produced by a decoder circuit together with enable signals for selecting one of available testing sequences. A row of regular memory cells or more than one of regular memory cells may be replaced with a redundant memory cell group, and more than one redundant memory cell group may be incorporated in a semiconductor memory device for rescuing the semiconductor memory device.

What is claimed is:

1. A semiconductor memory device having at least a regular data access sequence for data bits and a redundant data access sequence for redundant data, comprising:
   a) a regular memory cell array having a plurality of regular memory cells for storing said data bits, said plurality of regular memory cells being divided into a plurality of regular memory cell groups;
   b) a plurality of redundant memory cells for storing selected data bits of said data bits, at least one of said plurality of regular memory cell groups being replaceable with said plurality of redundant memory cells;
   c) an addressing system coupled to said regular memory cell array and said plurality of redundant memory cells, and responsive to external address bits for selectively transferring said data bits to an output port in said regular data access sequence, said addressing system blocking said output port from said data bits in said redundant data access sequence;
   d) a sense amplifier unit associated with said regular memory cell array and said plurality of redundant memory cells, and operative to discriminate the logic level of each data bit selectively transferred to said output port in said regular data access sequence;
   e) a redundant data accessing unit enabled with a test signal indicative of a request for said redundant data access sequence, and producing an information signal indicative of said redundant data in cooperation with said sense amplifier unit in said redundant data access sequence;
   f) a redundancy unit storing said redundant data, and operative to discriminate an access to said at least one of said plurality of regular memory cell groups for selectively outputting said selected data bits instead of the data bits supplied from said at least one of said plurality of regular memory cell groups in said regular data access sequence, said redundancy unit being further operative to determine the logic level of said information signal in said redundant data access sequence; and g) an output circuit operative to selectively output said data bits in said regular data access sequence and to output a diagnostic signal indicative of the logic level of said information signal in said redundant data access sequence.

2. The semiconductor memory device as set forth in claim 1, in which said sense amplifier unit has at least first and second sense amplifier circuits,
   said redundant data accessing unit comprising
   a first discharging transistor responsive to a first gate control signal of an active level for providing a current path from an input node of said first sense amplifier circuit to a discharging line,
   a second discharging transistor responsive to a second gate control signal of said active level for providing a current path from an input node of said second sense amplifier circuit to said discharging line, and
   a logic circuit responsive to said test signal for changing one of said first gate control signal and said second gate control signal to said active level in said redundant data access sequence, thereby supplying said active level to the input node of one of said first and second sense amplifier circuits, wherein said logic circuit maintains both said first and second gate control signals in an inactive level in said regular data access sequence.

3. The semiconductor memory device as set forth in claim 2, in which said redundancy unit comprises
   a memory section for storing said redundant data indicative of a defective address assigned to said at least one of said plurality of regular memory cell groups,
   a comparator section operative to compare said defective address with an address indicated by parts of said external address bits for producing a hit signal indicative of a match between said defective address and said address,
   a first transfer gate responsive to the complementary signal of said hit signal for coupling said first sense amplifier circuit to said output circuit, and
   a second transfer gate responsive to said hit signal for coupling said second sense amplifier circuit to said output circuit.

4. The semiconductor memory device as set forth in claim 1, in which said sense amplifier unit has at least one sense amplifier circuit,
   said redundant data accessing unit comprising
   a first logic gate enabled with said test signal and producing a gate control signal when said redundancy unit discriminates said access to said at least one of said plurality of regular memory cell groups, and
   a discharging transistor coupled between said sense amplifier circuit and a discharging line and responsive to said gate control signal for changing the logic level of said information signal.

5. The semiconductor memory device as set forth in claim 4, in which said redundancy unit comprises
   a memory section for storing said redundant data indicative of a defective address assigned to said at least one of said plurality of regular memory cell groups,
   a comparator section operative to compare said defective address with an address indicated by parts of said external address bits for producing a hit signal indicative of a match between said defective address and said address, and
   a second logic gate provided for said addressing system and responsive to said hit signal for selectively outputting said selected data bits instead of the data bits supplied from said at least one of said plurality of regular memory cell groups in said regular data access sequence.

6. A memory device comprising
   a regular memory cell array having a plurality of regular memory cells selectively designated by using an address signal;
   a redundant memory cell array having redundant memory cells selectively designated by using said address signal;
   an addressing unit responsive to said address signal for producing a selecting signal;
   a first controlling unit responsive to said address signal for producing a first control signal and a second control signal;
   a first output unit receiving data read out from said regular memory cell array for outputting said data, and responsive to said first control signal for maintaining an output signal thereof in a first level;
   a second output unit receiving data read out from said redundant memory cell array for outputting said data, and responsive to said second control signal for maintaining an output signal thereof in a second level different from said first level; and
   a common output unit receiving said output signal from said first output unit and said output signal from said second output unit, and responsive to said selecting signal for selectively outputting one of said output signals to an output terminal.

* * * * *